United States Patent [19]

Merrill

[11] Patent Number: 5,003,256
[45] Date of Patent: Mar. 26, 1991

[54] CLOCK SKEW MEASUREMENT TECHNIQUE

[75] Inventor: John F. Merrill, Saratoga, Calif.

[73] Assignee: Amdahl Corporation, Sunnyvale, Calif.

[21] Appl. No.: 404,312

[22] Filed: Sep. 7, 1989

[51] Int. Cl.$^5$ ............................................. G01R 31/28
[52] U.S. Cl. ................................ 324/158 R; 324/73.1; 371/1; 371/22.1
[58] Field of Search ............... 324/158 R, 73.1; 371/1, 371/22.1, 25.1

[56] References Cited

U.S. PATENT DOCUMENTS

| | | | |
|---|---|---|---|
| 3,976,940 | 8/1976 | Chau et al. | 371/22.1 |
| 4,092,589 | 5/1978 | Chau et al. | 371/1 |
| 4,929,888 | 5/1990 | Yoshida | 324/158 R |

Primary Examiner—Ernest F. Karlsen
Attorney, Agent, or Firm—Fliesler, Dubb, Meyer & Lovejoy

[57] ABSTRACT

Method and apparatus are disclosed for measuring the clock offset between a reference latch point and a subject latch point in a system. In the system, an associated latch point is provided on each chip which has a subject latch point, the clock offset to which is to be measured. Test data distribution means is provided for distributing a test data signal from a test data source point to the data input of the reference latch point and to the data input of the associated latch point. Cross-transmission means are also provided for connecting together the data input of the reference latch point and the data input of the associated latch point. A pulse burst generator is connected to the clock source point in the system and a test data signal generator is connected to the test data signal source point. The test data signal generator responds to each burst of clock pulses by generating a logic level transition on the test data source point at a presettable time following a known one of the edges of the clock pulses in each burst. By adjusting the presettable delay in the test data signal generator, and observing the output of a given latch point after the last clock pulse in each burst reaches the clock input of the given latch point, a delay setting is determined at which the path delay for the following two paths are approximately equivalent: (1) the path from the clock source point through the clock distribution means to the clock input of the given latch point; and (2) the path from the clock source point through the test data signal generator, through the test data distribution means and to the data input of the given latch point.

31 Claims, 7 Drawing Sheets

CLOCK SKEW MEASUREMENT TECHNIQUE

BACKGROUND OF THE INVENTION

1. Field of the Invention

The invention involves clock signal distribution in digital systems, and more particularly, a method and apparatus for accurately measuring clock skew such that proper tuning apparatus may then be inserted.

2. Description of Related Art

Typical data processing apparatus comprises a plurality of latch points connected together by data paths, control signal paths, and combinatorial logic. As used herein, the terms "data path" and "control signal path" refer to those conductors and other apparatus which couple the data output of each source latch point to the data input of a destination latch point. Data paths and control signal paths may pass through combinatorial logic which may modify the signal on the data path or control signal path, often in response to signals on a different data path which also passes through the same combinatorial logic, but by definition cannot pass through another latch point. Such a latch point defines the end of one data or control signal path and the beginning of the next. Also, because of the equivalence between control and data signals, the two terms are used interchangeably herein.

A clock signal generated at some common point in a system is typically distributed to the latch points throughout the system, causing each latch point to perform some operation, for example, latching input data to outputs. Desirably, the operation occurs at all latch points at the same time. In large scale systems, operating at extremely high clock frequencies, special care must be taken to ensure that the clock signal arrives at all of the latch points at exactly the same time, or at least within some very tight tolerance. Otherwise, two different problems will limit the maximum clock frequency at which the system can be safely operated.

The first problem, known as the long path problem, arises on the longest data paths in the system. Assume that in a particular data path from a source latch point to a destination latch point, the data path delay is equal to $t_d$ and the clock skew between the source and destination latch points has a value of $t_s$. If the data path is very long, and if the clock frequency f is too high, then it may be that $t_d > 1/f + t_s$. In other words, if the source latch clocks in new data on a first clock pulse, that new data (possibly as modified by combinatorial circuitry in the data path) may not reach the destination latch point before the next clock pulse reaches the destination latch point. Thus the destination latch may clock in old data. To avoid this, therefore, the clock frequency must be slow enough to accommodate the longest data paths and largest clock skews in the system.

The second problem, known as the short path problem, arises when the data path delay from a source latch point to a destination latch point is shorter than the clock skew $t_s$ between the two latch points. Assume that the latch points consist of master-slave flip flops, in which data at the input is locked internally in the latch on the leading edge of the clock pulse and transmitted to the output of the latch on the trailing edge of the clock pulse. Assume further that prior to a particular clock pulse, the source latch has a first logic value on its output and a second logic value on its input. Finally assume that the first logic value has been present on the output of the source latch for a long enough period of time such that it (itself or as modified by combinatorial logic) is also present at the input of a destination latch point.

When the leading edge of a clock pulse arrives at the source latch, the second logic value is looked internally in the latch. The second logic value is then transferred to the output of the source latch on the trailing edge of the clock pulse. Ideally, where clock skew between the two latches is minimal, the destination latch will lock in the first value when the leading edge of the clock pulse arrives there. If the clock skew between the source and destination latch points is large enough, however, it is possible that the leading edge of the clock pulse will not arrive at the destination latch until after the second logic level arrives from the source latch. In this case the destination latch will erroneously lock in the second logic level instead of the first.

The short path problem is even more acute if the latch points are of the type which open for data-flow therethrough during the period between the leading and trailing edges of a clock pulse and look the output data only on the trailing edge of the clock pulse. In this situation, the destination latch point will lock in the wrong data whenever the new data, which appears on the output of the source latch point in response to the leading edge of a clock pulse, arrives at the input of the destination latch point at any time prior to the time when the trailing edge of the same clock pulse arrives at the destination latch point. The problem in this situation is alleviated by minimizing the width of each clock pulse, but it can never be improved beyond the still-problematic situation of master/slave flip flops described above. Again, therefore, the largest clock skew between source and destination latch points places a limit on the maximum safe clock frequency of the system.

Clock skew is typically minimized through the two-step process of first measuring it and then inserting appropriate delays in the shorter clock distribution paths. These steps are typically performed at the board level, from a clock source point on the board to the clock input of each integrated circuit on the board, and also on a system level, from some system clock source point to the clock source points of each board in the system. Clock tuning is usually not needed between different latches fabricated on the same integrated circuit chip. In large-scale, high-performance computer systems, clock tuning must typically be performed for each individual system before its leaves the factory. The present invention relates to the measurement step in this process.

In the past, clock skew measurement has been performed using, illustratively, the apparatus shown in FIG. 1. Shown in FIG. 1 is a printed circuit board 10 which forms part of a larger data processing system. It includes thereon a clock source point 20 connected to the input of a distribution tree 22 having multiple outputs. The clock source point 20 is the point on the board 10 to which the master system clock will eventually be connected. Each of the outputs of distribution tree 22 is connected to a clock input of a different integrated circuit chip on the board. Two of the chips are shown, namely chips 24 and 26. Chip 24 has fabricated thereon its own distribution tree 28 having its input connected to one of the outputs of distribution tree 22, and having a plurality of outputs connected to the clock inputs of various latches on the chip 24. For example, one of the outputs of distribution tree 28 is connected to the clock input of a latch 40. Similarly, chip 26 has fabricated thereon a distribution tree 42 having its input connected to one of the outputs of distribution tree 22 and further having a plurality of outputs. One of the outputs of distribution tree 42 is illustratively connected to the clock input of a latch 44 on the chip 26. Further, in order to permit clock tuning, a probe point is provided for each chip on the board to which the clock signal is transmitted. These probe points are each connected via buffering circuitry to an otherwise unused output of the clock distribution tree on the corresponding chip. In FIG. 1, probe point 46 is connected to an output of distribution tree 28 via buffering circuitry 47, and probe point 48 is connected to an output of distribution tree 42 via buffering circuitry 49.

When it is desired to measure the clock skew between the two chips 24 and 26 (assumed to be the same as the clock skew between the latches 40 and 44), a variable frequency oscillator 30 is first coupled to the clock source point 20. A frequency counter 32 is also coupled to the output of the oscillator 30. A two-channel oscilloscope 34, having delayed triggering based on the first channel, then has its first channel input coupled to probe point 46 on chip 24 and its second channel input coupled to probe point 48 on chip 26. One of the chips, say chip 24, is designated a reference chip and the other, chip 26, is designated the subject chip. For the purposes of this description, the reference chip 24 is assumed to be closer to the latch source point 20 than is the subject chip 26.

The traces that will be seen on the oscilloscope will be substantially like those shown in FIG. 2a. The solid line in FIG. 2a is the trace due to the signal at the probe point 46, and the dotted line is the trace due to the signal at probe point 48. The time difference between them is equal to the sum of (a) the difference between the clock signal path delay from the clock source point 20 to the reference probe point 46 and the path delay from the clock source point 20 to the subject probe point 48, and (b) the known and fixed difference between the time for the signal at reference probe point 46 to reach the oscilloscope and the time for the signal at subject probe point 48 to reach the oscilloscope.

In order to measure the time delay between the two traces, the frequency of the oscillator 30 is adjusted until the two traces are exactly 180° out of phase, as shown in FIG. 2b. At this clock frequency, the delay between the traces is exactly equal to half the period of the clock signal. Since that period is exactly one divided by the frequency shown on the frequency counter 32, the difference between the (source-point/reference-probe-point/oscilloscope) path delay and the (source point/subject-probe-point/oscilloscope) path delay can be calculated. From this the difference between the (source-point/reference-latch-probe-point) path delay and the (source-point/subject-latch-probe-point) path delay can be calculated as well. The latter difference is taken as the clock skew between all of the latch points on reference chip 24 and all of the latch points on subject chip 26.

The above method of clock tuning works well, but does have limitations. First, the frequency at which the measurement is made depends on the actual value of clock skew; there is no easy way to make the measurements at the frequency at which the clock signal will actually be transmitted through the system. Since signal path delays are often frequency-dependent, the measurement obtained by the above method will be off by some amount because it was not taken at the ultimate operating frequency.

Secondly, it is very time consuming to manually tune the clock for each subject chip. The process may be automated, but the time required to adjust the frequency of the oscillator 30 and allow the frequency counter 32 to settle would still be comparatively long.

A third problem with the above method arises because of the need to probe signals on the board. For one thing, direct probing of such signals could potentially change them and cause erroneous results, and for another, the high density of modern boards makes it difficult to find space for sufficient numbers of probe points. A known solution is to provide the board with high input impedance selection logic to route all the clock signals to a small number of probe points in response to an external selection signal, but such selection logic itself introduces errors. Moreover, as circuit density increases and more and more points need to be tuned, the selection logic becomes more complex and worsens these errors.

It is therefore an object of the present invention to overcome some or all of the above problems.

It is another object of the present invention to provide a method and apparatus for measuring clock skew between two or more latch points in a system.

It is another object of the present invention to provide a method and apparatus for measuring clock skew between two or more latch points at different levels in a clock distribution tree in a system.

It is another object of the present invention to provide a method and apparatus for measuring clock skew between two or more latch points in a system on separate early, normal and late clock distribution trees.

SUMMARY OF THE INVENTION

The above objects and others are accomplished according to the invention by providing, in addition to a reference latch point, an associated latch point on each chip which has a subject latch point, the clock skew to which is to be measured. Test data distribution means is provided for distributing a test data signal from a test data source point to the data input of a reference latch point and to the data inputs of various ones of the associated latch points. Cross-transmission means are also provided for connecting together the data input of the reference latch point and the data inputs of various ones of the associated latch points.

A pulse burst generator is connected to the clock source point in the system and a test data signal generator is connected to the test data signal source point. The burst generator generates a burst of clock pulses having a frequency approximately equal to the frequency at which the clock will be operated when the system is in operation. The test data signal generator responds to each burst of clock pulses by generating a logic level transition on the test data source point at a presettable time following a known one of the edges of the clock pulses in each burst. If the transition in the test data signal reaches a given one of the latches before the effective edge of the last clock pulse in the corresponding burst reaches the given latch point, then it is the post-transition logic level which will be loaded into the latch point. If the transition reaches the data input of the given latch point after the effective edge of the last clock pulse in the corresponding burst reaches the clock input of the given latch point, then it is the pre-transition logic level which will be loaded into the latch point.

Thus, by adjusting the presettable delay in the test data signal generator, and observing the output of a given latch point after the last clock pulse in each burst reaches the clock input of the given latch point, it is possible to determine the delay setting at which the path delay for the following two paths are approximately equivalent: (1) the path from the clock source point through the clock distribution means to the clock input of the given latch point; and (2) the path from the clock source point through the test data signal generator, through the test data distribution means and to the data input of the given latch point.

Using this method, four measurements are taken. The first measurement is obtained by routing the test data signal directly to the first latch and then adjusting the delay in the test data signal generator until the delay in this path is equal to that of the clock path to the first latch. The second measurement is obtained by routing the test data signal to the first latch point not directly, but via the second latch point and the cross-transmission means, and adjusting the presettable delay until the delay in this second path equals that of the clock path to the first latch. The third measurement is obtained by routing the test data signal directly to the second latch point and adjusting the presettable delay until the delay in this third path equals that of the clock path to the second latch, and the fourth measurement is obtained by routing the test data signal to the second latch point via the first latch point and the cross-transmission means and adjusting the presettable delay until the delay in this fourth path equals that of the clock path to the second latch. It will be seen from the discussion below that these four measurements are sufficient to calculate the clock skew between the first and second latch points. In practice, the first latch point is a reference latch point and the second latch point is a dedicated associated latch point on the same chip as a subject latch point to which clock skew measurements are desired, and it is assumed that the clock skew between the reference latch point and the subject latch point is substantially the same as the clock skew between the reference latch point and the associated latch point.

A wide variety of circuit topologies may be used to implement the invention. Not all of the associated latch points need to have their data inputs connected directly to the test data distribution means, and not all of the associated latch points need to have their data inputs connected directly to the data input of any particular one of the other latch points by cross-transmission means; it is important only that two paths exist for any two latch points, the clock skew between which is to be measured: a path from the test data source point to the data input of the first of these latch points, and on to the data input of the second of these latch points via one of the cross-transmission means; and a path from the test data source point to the data input of the second of these latch points, and on to the data input of the first of these latch points via the same cross-transmission means but in the opposite direction. Additionally, the point where the cross-transmission means takes the test data signals from each of the latch points for transmission to the other, should be as close as possible to the data input of such latch point.

In addition to facilitating the accurate tuning of a large number of clock points to a single clock reference point, it will be seen that the invention may also be used to tune a large number of additional clock points to some or all of the clock points which are themselves tuned to the clock reference point. Thus multiple levels of clock tuning may be accomplished using the invention. The invention may further be used to tune the various points on clock distribution trees for different phases (e.g., early, normal and late) of a clock signal.

BRIEF DESCRIPTION OF THE DRAWINGS

The invention will be described with respect to particular embodiments thereof, and reference will be made to the drawings in which.

DETAILED DESCRIPTION

Basic Operation

Figure 3:
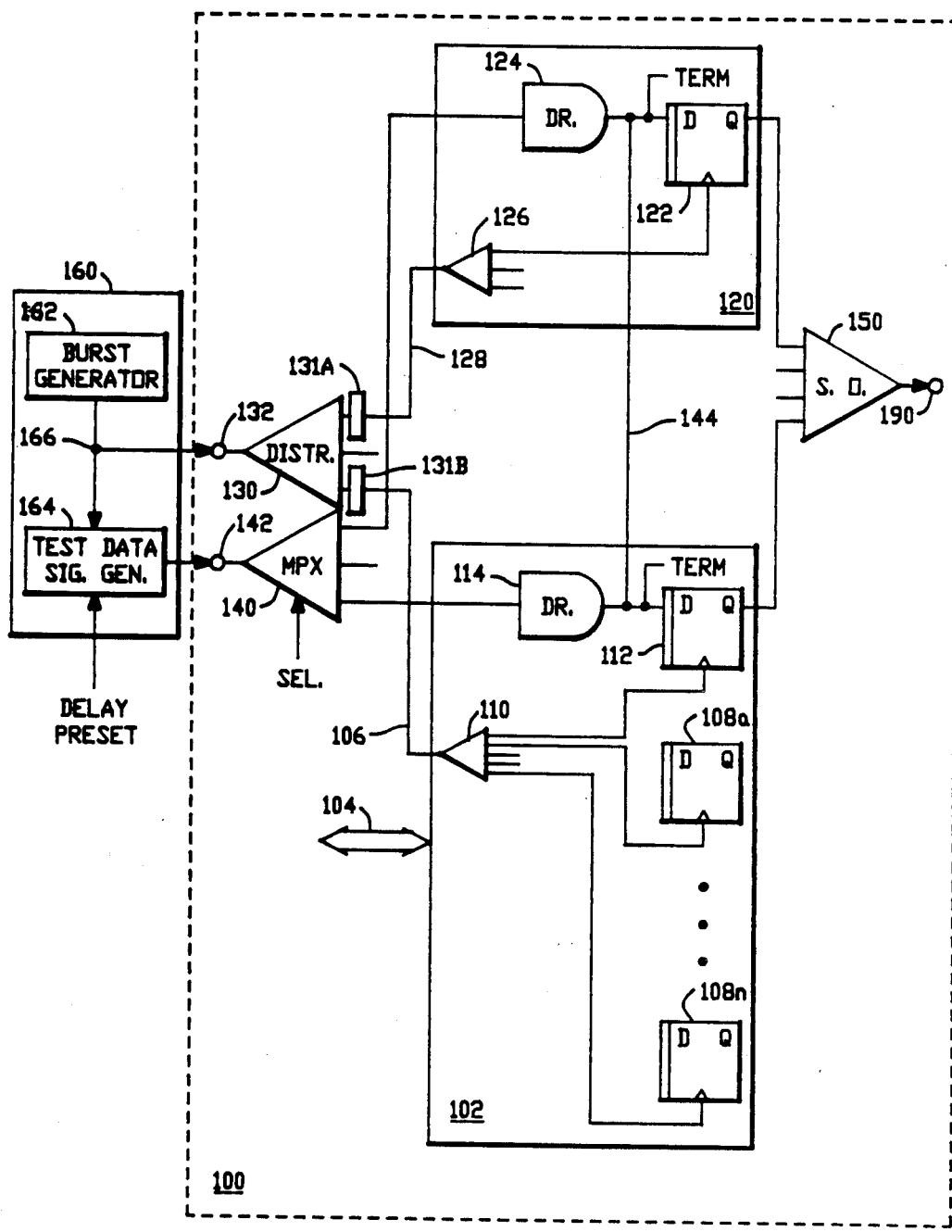
FIGS. 3 and 6–11 are schematic diagrams of apparatus according to the invention.

The basic operation of the invention will be shown with reference to FIG. 3. Shown in FIG. 3 is a board 100 which has a large number of integrated circuit chips located thereon. A typical one of those chips is designated 102, and has a plurality of control and data inputs and outputs, designated 104, and a clock input 106. The chip 102 has fabricated thereon a plurality of latches designated 108a through 108n, each of which has at least one D input, at least one Q or $\overline{Q}$ output, and at least one clock input. The clock inputs of all the latches 108a through 108n are connected to outputs of a clock distribution tree 110, the input of which receives the clock input from the clock input 106 to the chip 102. Thus, the clock inputs of all the latches 108a–108n all derive in this example from a single clock input for the entire chip. The chip 102 also includes a large amount of combinational circuitry, data paths and control lines, not shown, all designed to operate the chip 102 as a synchronous machine operating according to the clock signal on clock input 106.

According to the invention, integrated circuit chip 102 also includes an associated latch 112 having a D input, a Q output and a clock input. Like the latches 108a–108n, the clock input of associated latch 112 is connected to an output of the clock distribution tree 110 on the chip 102. The data input of the associated latch 112 is connected to the output of a driver 114, the input of which is connected off-chip as described below. The driver 114 need not be located on-chip as shown in FIG. 3; it is shown on-chip for illustrative purposes only.

The board 100 further includes a chip 120, on which is located a reference latch 122 with respect to which the clock skew to the latches on chip 102 are to be measured. Like associated latch 112, reference latch 122 includes a D input coupled to the output of a driver 124 (which need not be actually located on-chip), a clock input coupled to an output of an on-chip clock distribution tree 126, and a Q output. The input to clock distribution tree 126 is connected to receive the signal at a clock input 128 of the chip 120.

Also located on the board 100 is a board-level clock distribution tree 130, having its outputs coupled to the clock inputs of various ones of the chips on the board 100. One of these outputs is connected via a conventional adjustable delay element 131A to the clock input 128 of the chip 120, and another of these outputs is connected via a conventional adjustable delay element 131 B to the clock input 106 of chip 102. The input of the board-level clock distribution tree 130 is connected to a board clock input node 132.

Also located on the board 100 is a test data distribution multiplexer 140 having a data input coupled to a test data source point 142 on the board 100, a select input and a plurality of outputs. One of the outputs of the test data distribution multiplexer 140 is coupled to the input of driver 124 on chip 120, and another output is coupled to the input of driver 114 on chip 102. The test data distribution multiplexer 140 is designed to maintain a logic zero level on each of its data outputs except for the one output designated by the value on the select input. The output which is designated by the select input follows the data on the data input to the test data distribution multiplexer.

According to the invention, the D inputs to the reference latch 122 and the associated latch 112 are connected together by a cross-transmission wire 144. The cross-transmission wire 144 is terminated according to proper ECL design techniques both on its reference-latch end and on its associated-latch end.

The board 100 further includes scan-out circuitry 150, which has been used for testing purposes in the past. See, for example, commonly assigned U.S. patent application Ser. No. 040,738, entitled "MULTIMODE SCAN APPARATUS," filed Apr. 15, 1987 on behalf of Si and Merrick, incorporated herein by reference. In order to implement the present invention, two of the inputs to scan-out circuitry 150 are connected, respectively, to the Q output of reference latch 122 and to the Q output of associated latch 112. The output of scan-out circuitry 150 is connected to a probe point 190 on the board 100.

All the apparatus described above on board 100 remains in place when the board in is actual use in a larger system. For the purposes of testing clock skew, additional test apparatus 160 is coupled to the board. In the typical case, the test apparatus 160 includes a burst generator 162 for generating bursts of clock pulses, and a test data signal generator 164. The output of the burst generator 162 is removably coupled to the board clock input node 132 on the board 100, and is also coupled to a trigger input of the test data signal generator 164. The node from which the test data signal generator 164 takes its trigger signal is designated herein clock source point 166, and it will be understood that clock source point 166 may or may not be coincident with board clock input node 132. The output of the test data signal generator 164 is removably coupled to the test data source point 142 on the board 100, and also includes a delay preset input.

The test data signal generator, which may be a digital delay generator (DDG), is adapted to output a first logic level (e.g., 0-level) for a known period of time following activation of the trigger input, and then output the other logic level (e.g., 1-level) thereafter until reset. The delay between activation of the trigger input and the transition in the output signal is presettable in small increments, for example 5-picosecond increments, by the delay preset input. Also, advantageously, in order to obviate any instabilities associated with the first pulse in any burst of pulses, the test data signal generator 164 is adapted such that its trigger input is not activated until a known edge of the second or third pulse in each burst. A test data signal generating device which is suitable for performing the above functions is the Stanford Research Systems Model DG535.

The purpose of the setup of FIG. 3 is to measure the skew of the clock input to chip 102 with respect to the clock input of chip 120. Typically there will be many different chips such as 102 on the board 100, and the desire will be to measure the skew of the clock input of each of those chips with respect to the clock input of the reference chip 120. There is no need to measure the clock skew between different latches on the same chip, such as between latches 108a and 108n, since these clock skews are negligible compared to the clock skews introduced between different chips. The process variation across a single chip is small enough to be disregarded. Additionally, the negligibility of on-chip clock skews supports an assumption that the clock skew of the associated latch 112 on chip 102, with respect to the reference latch 122 on chip 120, is essentially the same as the clock skew of latches 108a–108n with respect to the reference latch 122. This important feature facilitates implementations of the invention.

Figure 4:
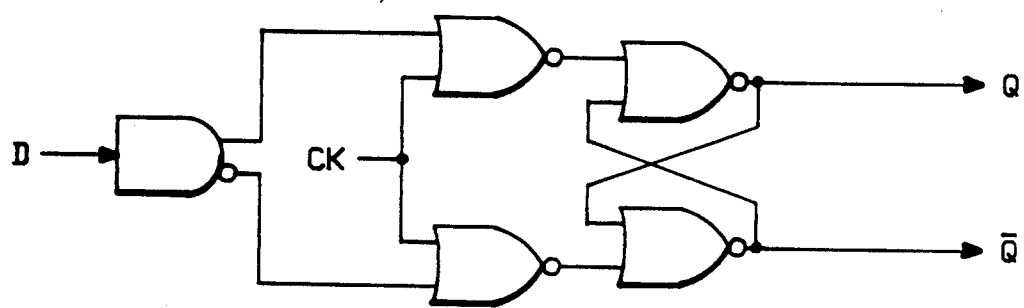
FIG. 4 is a schematic diagram of a latch point which may be used with the invention.

FIG. 4 shows a typical one of the latches 122, 112, or 108a–108n in detail. Its structure and operation are known, and will not be described in detail here. For the purposes of the present description it is sufficient only to note that whenever the clock input is high, the data on the D input flows immediately through to the outputs. When the clock input goes low, the state of the outputs is looked. Thus, the effective edge of the clock pulses for the latch shown in FIG. 4 is the falling edge of the clock pulse. That is, the outputs are locked with values responsive to the value on the D input just prior to the falling edge of the clock. If the clock pulses are considered to be positive-going pulses, then the effective edge of the clock pulse, with respect to this particular latch shown in FIG. 4, is the trailing edge of the clock pulse. It will be apparent from the description below that other types of latches may be used for the reference and associated latch points, such as slave/master latches. Additionally, other synchronous building blocks, such as counters, may also be used as latch points. It will also be understood that different latch points in the system may operate on different effective edges of the same clock pulse, for example, if one of them has an inverting clock input.

Figure 5:
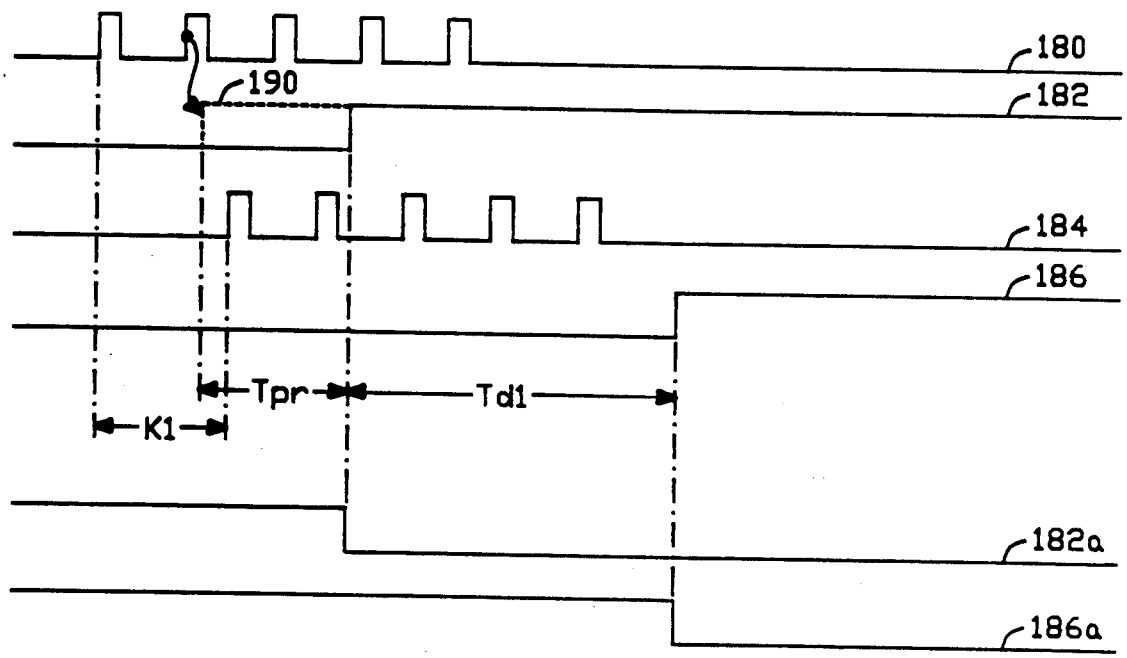
FIG. 5 is a timing diagram useful for explaining the operation of the invention.

Before describing the operation of the apparatus shown in FIG. 3 for calculating clock skew, it will be helpful to first understand how each measurement is taken and what it means. Referring first to the clock signal path and the test data signal path from the test apparatus 160 to the reference latch 122 in chip 120, it will be assumed that the burst generator 160 first generates a burst of five clock pulses. In actual operation, for reasons described hereinafter, this burst would typically include between 30 and 100 clock pulses occurring at approximately the clock frequency at which the system will ultimately be operated. Neither of these requirements is necessary for the present discussion, however. In FIG. 5, curve 180 shows the voltage as a function of time which appears at clock source point 166 in the test apparatus 160.

The test data signal generator 164 is set to have its trigger input activated on the rising edge of the second clock pulse to arrive, for reasons previously described. The dotted line 190 in curve 182 in FIG. 5 shows the activation of this trigger input. Activation occurs slightly after the rising edge of the second clock pulse in curve 180, to take into account the time delay between clock source point 166 and the trigger input of test data signal generator 164, and the period of time between the time that the rising edge of the second clock pulse arrives at the trigger input of the test data signal generator 164 and the time that it begins counting elapsed time for the purposes of the presettable delay time described below.

The output of the test data signal generator 164 remains at a logic 0 level until a presettable time, Tpr, after the activation of the trigger input. The presettable time Tpr is set by the delay preset input to the test data signal generator 164, and may be set manually or electronically, depending on the equipment. It is on the order of tens or hundreds of nanoseconds. At the end of the presettable time, the output of the test data signal generator 164 makes a transition to the 1-level, as shown in the solid line part of curve 182 in FIG. 5. The node at which the voltage for curve 182 is taken is the test data source point 142, which is considered to be the output of the test data signal generator 164.

The path delay in the clock distribution network, starting from the clock source point 166, passing through the distribution tree 130, along the board wiring to the clock input of chip 120, through the internal clock distribution tree 126 in chip 120 and to the clock input of reference latch 122, is an unknown but fixed time period K1. Curve 184 in FIG. 5 shows the voltage at the clock input to reference latch 122 in response to the clock pulse burst generated by the burst generator 162. It can be seen that this signal tracks the signal at the clock source point 166 (shown in curve 180) following the delay period K1.

Similarly, assuming that the test data distribution multiplexer is selected to route the test data signal to reference latch 122, there is a path delay Td1 for the test data signal traveling from the test data source point 142, through the test data signal distribution multiplexer 140 along the board wiring to the chip 120, through the driver 124 and into the D input of reference latch 122. Curve 186 in FIG. 5 shows the test data signal as it appears on the D input to reference latch 122, and it can be seen that the logic level transition in such signal follows the logic level transition in the signal as seen at the test data source point 142 (solid line curve 182), by the time period Td1.

Assuming the reference latch 122 is reset prior to each trial, such that its Q output is zero, it can be seen that if the logic level transition in the test data signal arrives at the D input of reference latch 122 subsequent to the time that the falling edge of the last clock pulse in the clock burst arrives at the clock input of reference latch 122, as shown in curves 184 and 186 in FIG. 5, then the value which will be latched into reference latch 122 and which will appear on the Q output of reference latch 122 is that value which responds to a zero-level on the D input. Stated conversely, if the Q output of the reference latch 122 remains at a zero-level, then the path delay from the clock source point 166, through the test data signal generator 164, including the presettable delay Tpr, and along the data path to the D input of reference latch 122, is longer than the path delay from the clock source point 166, through the clock distribution network on the board to the clock input of reference latch 122. Similarly, if the Q output of reference latch 122 changes to a logic 1, then the test data path delay was shorter than the clock signal path delay.

The measurement which needs to be taken is that value of Tpr, for which the data path delay from the clock source point 166 to the D input of reference latch 122 equals the clock signal path delay from the clock source point 166 to the clock input of reference latch 122. The value of Tpr which satisfies this equality is referred to herein as TA1. Depending on the equipment used, there are several possible ways of determining TA1. If the test data signal generator 164 is a digital delay generator, where Tpr can be specified only in increments, Tpr may be set initially to a very small value and gradually incremented for repeated trials until the first setting is reached at which the Q output of reference latch 122 is at a logic one level following the trial. Alternatively, a binary-type search may be conducted for that setting. The value for TA1 can then be approximated as the average between the highest Tpr setting which yields a logic 0 output and the lowest Tpr setting which yields a logic 1 output.

If the test data signal generator 164 is an analog delay generator, having a continuously variable Tpr, then the value of Tpr may be adjusted for repeated trials until 50% of the trials at a fixed Tpr yield a logic one on the Q output of reference latch 122 and 50% yield a zero. TA1 can then be considered approximately equal to that final setting of Tpr.

Another method for determining TA1 if the test data signal generator 164 is a digital delay generator, is by performing many different trials for different Tpr settings until the two adjacent settings are found at which, respectively, slightly more than 50% of the trials yield a logic zero output and slightly more than 50% of the trials yield a logic one output. TA1 can then be approximated through a weighted interpolation between those two settings of Tpr. This method of determining TA1 is advantageous in that it tends to cancel errors which would otherwise result if the test data signal generator 164 has some jitter.

Other methods for determining the measurement TA1 will be apparent, and some of these are described below.

In order to use the apparatus of FIG. 3 to calculate the clock skew between reference latch 122 and associated latch 112, four measurements are made. The first is TA1, as described above. The second, TA2, is the setting Tpr for test data signal generator 164 at which the data path and clock signal path to associated latch 112 have an equal delay, with the test data signal multiplexer 140 still set to route the test data signal from test data source point 142 to the D input of reference latch 122. This means that the data path delay is not just the delay from the clock source point 166 to the D input of reference latch 122, but also includes the delay along the cross-transmission wire 144 from the D input of reference latch 122 to the D input of the associated latch 112.

In a similar manner, the third measurement, TB1, is made by observing the Q output of reference flip flop 122 but causing the test data distribution multiplexer 140 to route the test data signal to the D input of associated latch 112. The fourth measurement, TB2, is made by observing the Q output of associated latch 112, with the test data distribution multiplexer 140 set to route the test data signal directly to the D input of associated latch 112.

For the following equations, the constant K1 is defined as the total fixed delay from the clock source point 166 to the clock input of the reference latch 122, and K2 is defined as the total fixed delay from the clock source point 166 to the clock input of the associated latch 112. KA is defined as the sum of all the fixed delays from the clock source point 166 via the test data distribution network to the D input of reference latch 122, and equals the total delay along that path minus the presettable delay period Tpr. Similarly, the constant KB is defined as the sum of all the fixed delays from the clock source point 166 via the test data distribution network to the D input of associated latch 112, and equals the total delay along that path minus Tpr. Tp12 is defined as the fixed path delay along the cross-transmission wire 144 from the D input of the reference latch 122 to the D input of the associated latch 112, and Tp21 is the delay along the same wire in the opposite direction. As will be seen, it is not necessary that any of the above constants be known in advance, since they all drop out or are determined during the calculation. However, those that are known from one calculation can, of course, be used in a subsequent calculation (e.g., for determining clock skew with respect to a different chip on the board 100) in order to reduce the time required to tune the entire board.

Because of the way that the values TA1, TA2, TB1 and TB2 were determined, the following four equations hold:

$$TA1 + KA = K1 \quad (1)$$

$$TA2 + KA + Tp12 = K2 \quad (2)$$

$$TB2 + KB = K2 \quad (3)$$

$$TB1 + KB + Tp21 = K1 \quad (4)$$

Subtracting eq. 1 from eq. 2 eliminates the constant KA and leaves:

$$TA2 - TA1 = To12 - Tp12, \quad (5)$$

where To12 equals (K2−K1) and represents the clock offset of the associated latch 112 relative to the reference latch 122. Similarly, subtracting eq. 3 from eq. 4 yields:

$$TB1 - TB2 = To21 - Tp21 \quad (6)$$

where To21 equals (K1−K2) and is the clock offset of the reference latch 122 with respect to the associated latch 112. Since Tp12=Tp21, and To12=−To21, substitutions can be made into eqs. 5 and 6 to yield:

$$TA2 - TA1 = To12 - Tp12 \quad (7)$$

$$TB1 - TB2 = -To12 - Tp12 \quad (8)$$

Eqs. 7 and 8 constitute two equations in two unknowns (clock offset To12 and chip-to-chip delay Tp12 along the cross-transmission wire 144), which can be solved as follows:

$$To12 = [(TA2 + TB2) - (TA1 + TB1)]/2 \quad (9)$$

$$Tp12 = [(TA1 + TB2) - (TA2 + TB1)]/2 \quad (10)$$

Thus it can be seen that the clock skew To12 between associated latch 112 and reference latch 122 can be calculated from the four measurements TA1, TA2, TB1 and TB2. The clock skew with reference to the reference latch 122 of the subject latches 108a–108n, which are the latches actually of interest in chip 102, since they are the ones which are used in the state machine, are all assumed to be substantially the same as that of associated latch 112.

Sources of Error

Since clock tuning is a critical high-precision step in the completion of a high-speed data processing system, the user should be aware of several possible sources of error and what effect they have. The most important of these sources are discussed below.

1. Errors in Test Data Signal Generator 164. The offset between the time that the trigger input of the test data signal generator receives an edge of a clock pulse and the time that it begins counting for the presettable time Tpr is uncertain but unimportant. As long as this offset is constant it forms part of KA and KB, and cancels out in the equations. It is this effect which also permits the test data signal generator 164 to be set to activate on some clock pulse other than the first clock pulse in each burst, as long as the number of that clock pulse remains constant. Actually, it is important only that the time between (1) the trigger activating edge of whichever clock pulse is used, and (2) the effective edge of the last clock pulse in the burst, remain constant.

The linearity of the test data signal generator 164 (actual v. specified Tpr) has a direct effect on the accuracy on the result. Since the result is computed from four measurements, the accuracy of each measurement needs to be four times the accuracy of the desired result for non-random errors, or twice the accuracy for random errors. The accuracy achievable for the final result should be approximately 30 ps. It has been found that currently available test data signal generators, such as the aforementioned DG535, are sufficiently linear to meet this goal.

The accuracy of the results also depends on the repeatability (jitter) in the test data signal generator 164 and in the test data paths and clock paths. It will also depend on the resolution with which Tpr may be specified. The effect of both of these limitations can be minimized using the statistical methods described above for approximating the TA and TB values from multiple trials.

2. Test Data Signal Characteristics. The rise time of a data signal usually has an effect on the effective delay of the path along which it is traveling. This can be seen by considering a destination device having an input for receiving the signal. Digital devices typically have a threshold above which the input must rise before the device will recognize that it has received a 1-level input. This threshold level typically remains constant for constant operating conditions. Thus, it will take longer for the destination device to recognize that a transition has occurred from a 0-level to a 1-level if the rise time of that transition is slow, than it would take if the rise time is fast.

A slow rise time in the test data distribution paths as well as in the clock signal distribution paths will have no effect on the calculation of the clock offset according to the invention, however, since as long as the rise times remain constant, any delay between the time that a transition begins and the time that a destination device recognizes the transition simply becomes part of the effective path delay constants KA, KB, K1 and K2. As explained above, these constants fall out in the calculations. The same is true if there is attenuation in any of these paths, such that the rise time at the destination end of a path is slower than the rise time at the source end of the path.

One potential source of error that should be minimized derives from the possibility of reflections occurring on the cross-transmission wire 144. These errors can be minimized using proper ECL terminations, which are usually required for ordinary system operation anyway. The effect of reflections can be further minimized by permitting enough time between trials for any reflections on the cross-transmission wire 144 to die down.

3. Latch Characteristics. Latch threshold voltage offset can introduce errors in the latch clock path calculations. For example, if the associated latch 112 has a threshold voltage offset that is 10 mV higher than the reference latch 122, a 200 ps rise time waveform will take 4 ps longer to reach the threshold of the associated latch 112 than it will take to reach the threshold of reference latch 122. When the test data signal is traveling along the cross-transmission wire 144 from the reference latch 122 to the associated latch 112, this 4 ps error will add to the path delay. When the test data signal travels in the opposite direction, the 4 ps delay will subtract from the path delay. The effect on the calculated result will be to add a 4 ps error to the calculated clock offset To12.

Errors due to latch threshold voltage offset may be minimized by performing the four measurements described above a second time, using the opposite polarity transition in the test data signal. That is, instead of presetting the latch 22 or 112 to a 0-level prior to each trial and causing the test data signal generator 164 to generate a positive-going transition at the presettable time following activation of the trigger, the latch is preset with a logic 1, and the test data signal generator 164 generates a negative-going transition after the presettable time. A test data signal which meets this requirement is shown in curves 182a and 186a, as observed at the same nodes as curves 182 and 186, respectively, all in FIG. 5. An average To12 is then obtained by using values for TA1, TA2, TB1 and TB2 which have been averaged by any of the methods described above.

Latch setup time, too, could be different between chips, though all the latches on the same chip should have substantially the same setup times due to small process variations. Any time difference in the setup time between chips will affect the calculation of clock skew, but that is precisely what is desired. Clock tuning is a process for adjusting the clock distribution between chips so that the chips can exchange data in a timely manner. A difference in the setup time between latches on different chips is therefore properly included in the measurement of clock skew.

Figure 1:
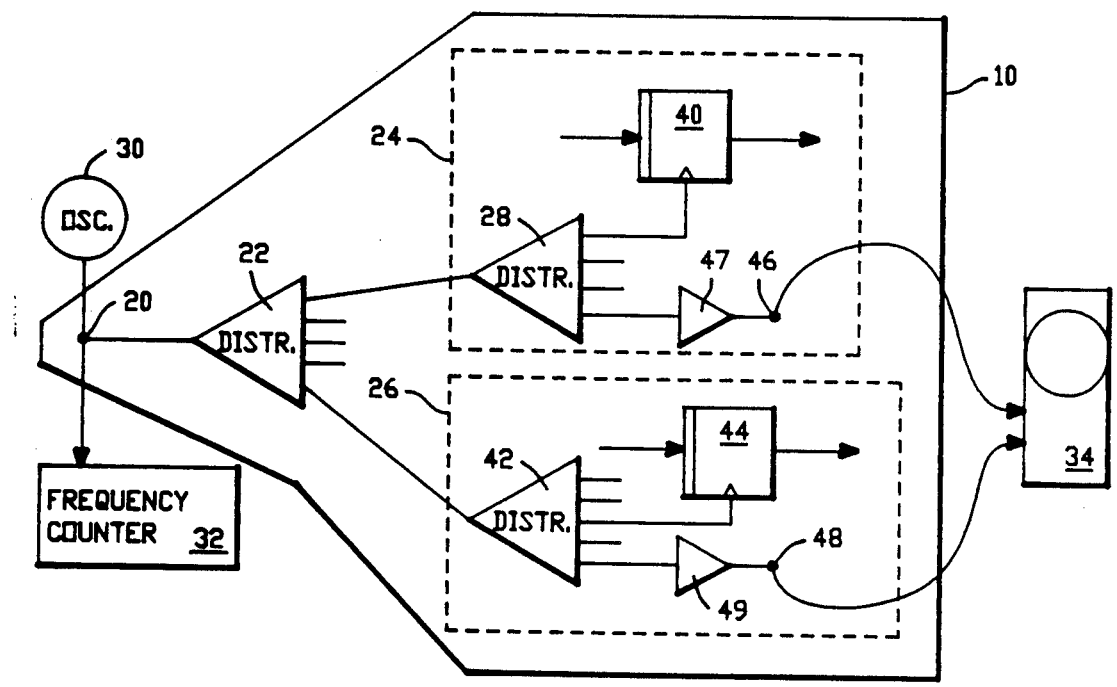
FIG. 1 is an illustrative diagram of prior art apparatus for measuring clock offset.
Figure 2A:
FIGS. 2a and 2b show oscilloscope traces which may be obtained using the apparatus of FIG. 1.
Figure 2B:

4. Effect of Probings on Clock Signal Characteristics. In prior art clock tuning methods such as that illustrated in FIGS. 1 and 2, the clock signal was probed through buffering circuitry to form an input to the oscilloscope or other test apparatus. This probing itself affected the loads on the clock signals, thereby introducing errors into the results. No such probing error is introduced in the present apparatus, since time-sensitive signals are not probed directly. The only signals which are observed are the outputs of the reference and associated latches 122 and 112, which are outside the signal paths being measured. Moreover, these outputs are permanently wired via scan-out network 150 to probe point 190; there is no loading anywhere in the signal paths which will not be present when the board 100 is in actual operation or which is not otherwise taken into account in the calculations. Finally, the only signals which are observed in the inventive technique are level signals, unlike the high-frequency signals observed in the prior art technique; a probe-induced change in the frequency at which these signals change, or in the waveform characteristics of such signals, is irrelevant to the calculation of clock offset.

5. Temperature Variations. Temperature changes may affect the signals generated by the test apparatus 160 and thereby affect the accuracy of the calculated clock offset. The test apparatus should therefore be maintained at a constant temperature, and a counter may be added for accurately measuring cycle time to ensure that it remains so.

Errors which occur due to temperature variations on the board 100 are part of the product. Measurements should therefore be taken at the normal operating temperature of the system and should be controlled at that point if necessary.

6. Synchronous noise. It has been observed during tests of apparatus according to the invention that significant cross-talk can sometimes take place from the signals in the clock distribution network on a board to the data paths on the board. This induces on the data lines a low-level voltage which varies at the frequency of the clock signal. Whereas the induced voltage is too small in magnitude to cause any problem by itself, it can cause erroneous measurements when added to a data signal undergoing a transition. For example, suppose that at the D input to either reference latch 122 or associated latch 112, a maximum in the induced voltage level occurs at the same time that a 0-1 transition occurs in the data signal. Recalling that the transition in the data level signal has a finite non-zero rise time, it will be appreciated that the composite signal will reach the latch input's threshold voltage at an earlier time than it would if there were no synchronous noise. Similarly, if the data signal transition occurs when the induced voltage is at a minimum, the composite signal will reach the latch input's threshold voltage at a later time than it would if there were no synchronous noise.

In the circuit implementation shown in FIG. 3, the D inputs of the reference latch 122 and associated latch 112 are preceded respectively by drivers 124 and 114. These drivers serve to sharpen the rise times of the test data signal transitions as they approach the D inputs of the latches. However, the synchronous noise problem is not alleviated since the inputs to the drivers, too, have threshold voltages which decide the state of the input signal. Thus for the purposes of this description, it is equivalent to refer to the data path signals as observed at the driver inputs as if they were being observed directly at the D inputs of the respective latches.

Errors due to synchronous noise can be minimized using the same technique described above for minimizing the errors due to latch-threshold voltage offset. This can be seen by considering that if the preset delay of test data signal generator 164 is kept constant for both of two trials, then the data signal transition will reach the D input of the latch at a substantially the same time (neglecting jitter) relative to the time that a respective triggering clock pulse reached the clock source point 166. Since the physical position of the conductors in the clock distribution tree relative to the conductors in the data path have not changed between the two trials, the waveform at the D input of the latch of the synchronous noise signal induced in the data path will also be substantially the same between the two trials, again relative to the time that the triggering pulse reached the clock source point 166. That is, the waveform will have the same shape as it did on the previous trial, and its peaks and valleys will occur at the same time relative to the time that the triggering pulse reached the clock source point 166.

Thus, assuming the positive-going transition reaches the D input of the latch with a rise time substantially the same as the fall time with which the negative-going transition of the data signal in the second trial reaches the D input of the latch, then the composite signal at the D input of the latch will reach the threshold just as late in the second trial relative to the nominal time, as the composite signal on the data path reached the threshold in the first trial earlier than the nominal time. When the two observed preset time delay periods Tpr are averaged, the errors will tend to cancel.

Relating One Point to Many Points

Figure 6:
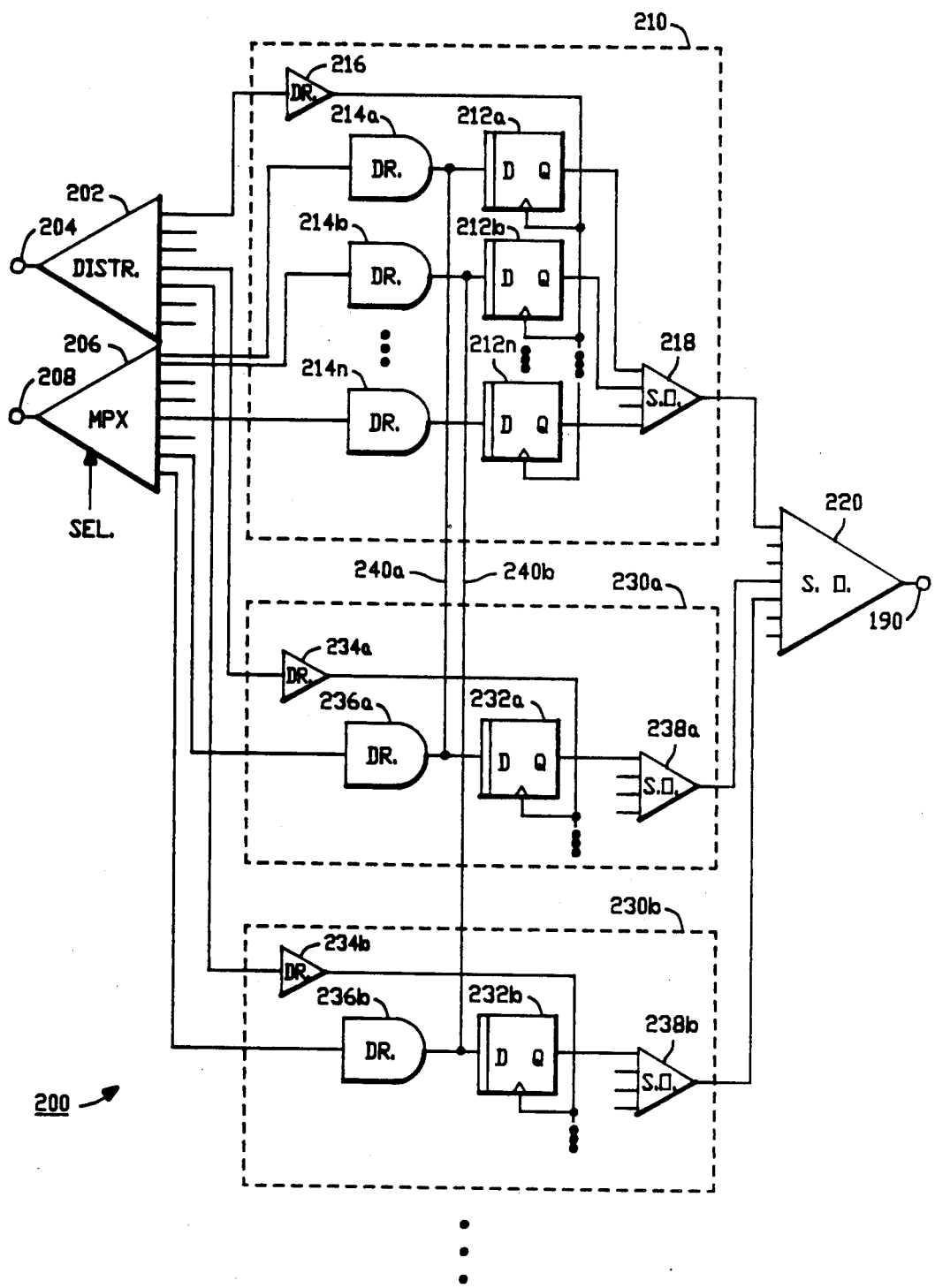

In a practical system, it is usually necessary to determine the clock skew of many different chips with respect to a reference chip. FIG. 6 shows apparatus according to the invention by which this may be accomplished.

All of the apparatus shown in FIG. 6 is formed on a single board 200. As with the apparatus of FIG. 3, the apparatus of FIG. 6 includes a clock distribution tree 202 having an input coupled to a board clock input node 204, and having multiple outputs for driving the clock inputs of each of the various chips on the board. The apparatus 200 also includes a multiplexer 206, having a test data input coupled to a test data source point 208 on the board, and having a select input for selecting which of multiple outputs of the multiplexer 206 will receive the signal from the test data source point 208.

The apparatus 200 further includes a reference chip 210, on which is fabricated a plurality of reference latches 212a, 212b, . . . , 212n, the D input of each of which is driven by a respective driver 214a, 214b, . . . , 214n. The clock inputs of each of the latches 212a–212n are all connected together and to the output of an on-chip clock driver 216, the input of which is connected to one of the outputs of clock distribution tree 202. The Q outputs of each of the latches 212a–212n are connected to respective inputs of an on-chip scan-out circuit 218, the output of which is connected off-chip to one of the inputs of a board-level scan-out circuit 220. The inputs to each of drivers 214a–214n are connected to respective outputs of the test data multiplexer 206.

In addition to the reference chip 210, the board also includes a plurality of subject chips 230a, 230b, . . . , 230n (only the first two of these being shown in FIG. 6). The subject chip 230a includes a plurality of subject latches (not shown) for which the clock offset is desired. According to the invention, instead of measuring the clock offset to the subject latches, the subject chip 230a further has fabricated thereon an associated latch 232a which is dedicated to the clock skew measurement scheme. As previously mentioned, the measurement of clock offset to the associated latch 232a approximates the clock offset to the subject latches in subject chip 230a sufficiently closely for most purposes.

The subject chip 230a further has fabricated thereon a clock driver 234a, the output of which connects to the clock input of each of the latches on the chip, including associated latch 232a. The input of clock driver 234a is connected to one of the outputs of clock distribution tree 202. The D input to associated latch 232a is connected to the output of a driver 236a, the input of which is connected to one of the outputs of the test data multiplexer 206, and the Q output of associated latch 232a is connected to one of the inputs of a scan-out network 238a.

The subject chip 230b is another chip on the board, and like the subject chip 230a, includes a plurality of subject latches, not shown in FIG. 6. Clock offset is instead measured to an associated latch 232b, which clock offset is taken to be a good approximation of the clock offset to each of the subject latches on chip 230b. Thus, similarly to the subject chip 230a, the chip 230b has fabricated thereon a clock driver 234b, the input of which is connected to one of the outputs of clock distribution tree 202, and the output of which is connected to the clock inputs of each of the latches on the chip 230b, including associated latch 232b. The chip 230b further includes a driver 236b, the input of which is connected to one of the outputs of test data multiplexer 206, and the output of which is connected to the D input of associated latch 232b, and further includes a scan-out network 238b, one of the inputs to which is connected to the Q output of associated latch 232b. The outputs of the scan-out networks 238a, 240b, . . ., 238n are all connected to respective inputs of board-level scan-out network 220.

Board 200 also includes a plurality of cross-transmission wires 240a, 240b . . . , 240n (only the first two of which are shown in FIG. 6). The cross-transmission wire 240a is connected between the D input of reference latch 212a on reference chip 210 and the D input of associated latch 232a on subject chip 230a, while the cross-transmission wire 240b is connected between the D input of the reference latch 212b on the reference chip 210 and the D input of the associated latch 232b on the subject chip 230b. Similarly, the remainder of the cross-transmission wires (not shown in FIG. 6) are connected between the D inputs of the remainder of the reference latches 212 on reference chip 210 and the D inputs of associated latches 232 on corresponding subject chips 230. Termination resistors are also included at both ends of each of the cross-transmission wires 240, but for simplicity they are not shown in FIG. 6.

The operation of the apparatus of FIG. 6 for measuring clock skew to each of the subject chips 230 is substantially the same as the operation of the apparatus of FIG. 3. The only difference, of course, is that n different sets of measurements are made to obtain a different calculated clock offset for each of the n subject chips.

Importantly, the reference point to which clock offset is measured according to this technique will be different for different ones of the subject chips 230a, 230n. That is, for example, the technique will yield the clock offset of associated latch 232a with respect to reference latch 212a, but it will yield the clock offset of associated latch 232b with respect to reference latch 212b, not 212a. This is not a significant problem according to the invention, however, since the clock offset of reference latch 212b with respect to reference latch 212a is negligible because they are both fabricated on the same chip. The clock offset of a latch on any of the subject chips on the board, calculated with respect to any of the reference latches 212b, . . . , 212n is therefore an excellent approximation of the clock offset of that chip with respect to the reference latch 212a. Therefore, the inventive technique, as implemented with the apparatus of FIG. 6, successfully measures the clock offset of each of the subject chips 230, all essentially with respect to a single point.

While chip 210 is referred to herein as a reference chip, it will be understood that it need not contain only reference latches. Indeed the number of latches on the chip used as reference latches may be very small compared to the total number of latches on the chip 210. The remainder of the latches on chip 210 may perform other useful data processing functions and, since they are all located on the same chip as the reference latches 212 which are used to reference the clock offsets of the other chips on the board, may be considered to have a zero clock offset.

The apparatus of FIG. 6 is also shown as having the clock inputs and test data inputs of all the chips connected to respective output of a single layer of clock distribution tree 202 and test data multiplexer 206. It will be appreciated, however, that the clock distribution tree 202 and test data multiplexer 206 may well have multiple levels of distribution trees and multiplexers, respectively. Additionally, the various outputs of each of these networks may well come from different levels of the network. That is, clock distribution tree 202 may well be designed to have a first level of drivers having multiple outputs, some of which are connected to a second level of drivers and others of which are provided directly as outputs of the distribution tree 202. Similarly, test data distribution multiplexer 206 may well have one layer of multiplexers having several outputs, some of which are connected to a second level of drivers and others of which are provided directly as outputs of the multiplexer 206.

As far as the calculations are concerned, there is no need for all of the chips 210 and 230 to be connected to the same level outputs of clock distribution tree 202 or test data multiplexer 206. If the path delay to one output of the test data multiplexer 206 differs from the path delay to a different output, then it is a fixed difference which cancels out in the calculation. If the path delay to one output of clock distribution tree 202 differs from the path delay to a different output, then the difference is properly included in the calculation of clock offset.

Topological Variations

Figure 7:
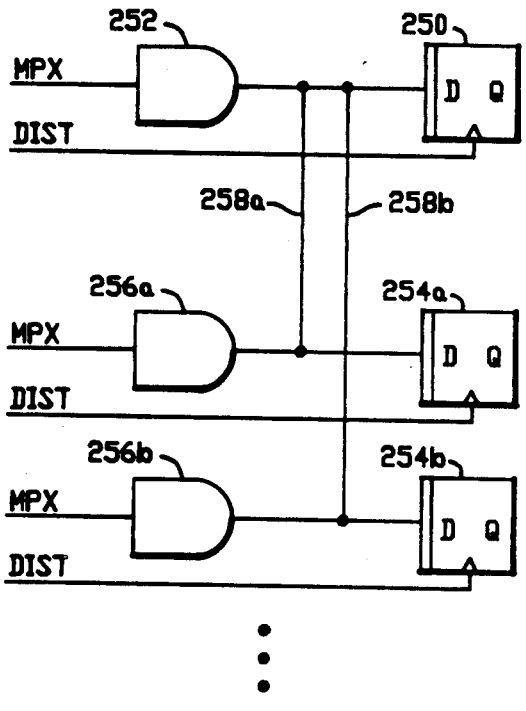

FIG. 7 shows a variation of the apparatus of FIG. 6 for determining the clock offset of a plurality of chips on a board. The implementation differs from that of FIG. 6 in that only one reference latch is required.

Referring to FIG. 7, a reference latch 250 is provided, to which the clock offset of all of the other chips on the board is to be determined. The D input to the reference latch 250 is connected to the output of a driver 252, the input of which is connected to one of the outputs of the test data distribution multiplexer (not shown in FIG. 7) on the board. As with the apparatus of FIG. 6 and the apparatus of FIG. 3, each of the subject chips on the board includes an associated latch 254, designated 254a, 254b, ..., 254n, respectively, for the n chips on the board. For simplicity, the individual chip boundaries are not shown in FIG. 7, nor are any of the subject latches. Similarly, the scan-out networks are not shown in FIG. 7. The cross-transmission wire for associated latch 254a is connected between the D input to the associated latch 254a and the D input to the reference latch 250. The cross-transmission wire 258b is connected between the D input of associated latch 254b and the D input of the very same reference latch 250.

The operation of the apparatus of FIG. 7 in order to determine clock offsets is once again the same as that of FIG. 3 and FIG. 6. The clock offset of associated latch 254a with respect to reference latch 250 is calculated by taking four measurements TA1, TA2, TB1 and TB2, where the test data signal multiplexer activates the data path to reference latch 250 for the TA measurements and the data path to associated latch 254a for both of the TB measurements. The test data distribution path to the associated latch 254b is never activated during these measurements and the Q output of associated latch 254b is never observed. Except for the loading effects introduced by the presence of cross-transmission wire 258b, therefore, the measurement of the clock offset of associated latch 254a with respect to the reference latch 250 proceeds identically to that of FIG. 3. Nor do the loading effects introduced by the cross-transmission wire 258b degrade the accuracy of the results, since all errors which it might introduce are either inherently cancelled as described above or can be minimized by the techniques described above. Moreover, the loading itself can be minimized through the use of proper ECL termination techniques.

Similarly, in order to determine the clock offset to associated latch 254b with respect to reference latch 250, the four measurements TA1, TA2, TB1, and TB2 are taken with the test data multiplexer activating the data path to reference latch 250 for both of the TA measurements, and activating the data path to the associated latch 254b for both of the TB measurements. In this case the data path to the associated latch 254a is never activated, and the Q output of associated latch 254a is never observed.

The apparatus shown in FIG. 7 for determining the clock offset of many different chips on a board all with respect to a single point is advantageous over the apparatus of FIG. 6, since only one reference latch 250 is needed to reference a large number of points. It is also advantageous because a single TA1 measurement may be made and used in the calculations of all the clock offsets, without the albeit slight degradation in accuracy that this shortcut would introduce if used with the apparatus of FIG. 6.

Figure 8:
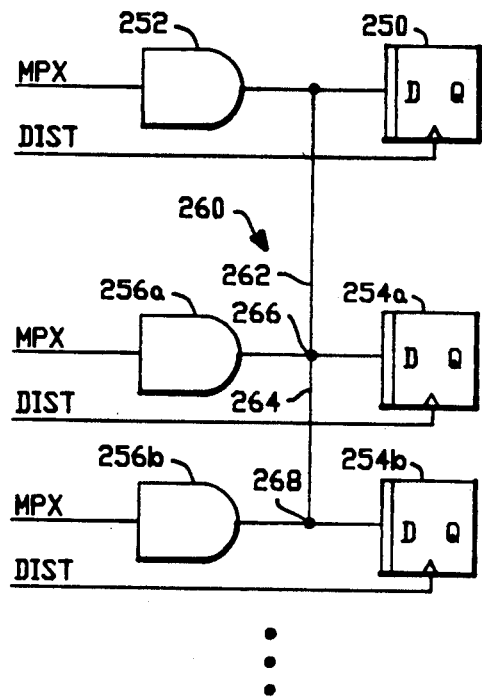

It should be noted that there is no reason why the cross-transmission wires need all have one of their ends connected to the D input of the reference latch 250 as shown in FIG. 7. FIG. 8 shows a different topology, in which a single cross-transmission wire 260 has two portions 262 and 264. The portion 262 has one end connected to the D input of associated latch 254a and its other end connected to the D input of reference latch 250, similarly to cross-transmission wire 258a in FIG. 7. The portion 264 of the cross-transmission wire 260, however, has one end connected to the D input of associated latch 254b and its other end connected to the D input not of reference latch 250, but of associated latch 254a.

The clock offset of associated latch 254a with respect to reference latch 250 is calculated using TA measurements made with the test data signal routed to the reference latch 250, and the TB measurements made with the test data signal routed to the associated latch 254a. The clock offset of associated latch 254b with respect to reference latch 250 is calculated from measurements of TA taken with the test data signal routed to the reference latch 250 and TB measurements taken with the data signal routed to the associated latch 254b. As with the topology of FIG. 7, the test data distribution path to the associated latch 254b is never activated when measurements are being made for the clock offset of associated latch 254a, and the test data distribution path to associated latch 254a is never activated when measurements are being made for the clock offset to associated latch 254b. The fact that in the topology of FIG. 8 the cross-transmission wire between the reference latch 250 and the associated latch 254b includes part of the cross-transmission wire which is used to make the measurements to calculate the clock offset of associated latch 254a, does not change the equations or the accuracy of the results.

It will be appreciated that many different topologies for the cross-transmission wires are possible within the scope of the invention. In actuality, the only substantial limitation on the topology is that on the conductor connecting the output of a driver to the D input of the latch being measured, the junction with the cross-transmission wire should be as close as possible to the D input of the latch. Significant transmission discontinuities are thereby avoided. Also, the length of that conductor should be as similar as possible for all latches to help cancel the errors. Another consideration is that it is undesirable to have one transmission line joining in the middle of another, since impedance mismatch may result.

Figure 9:
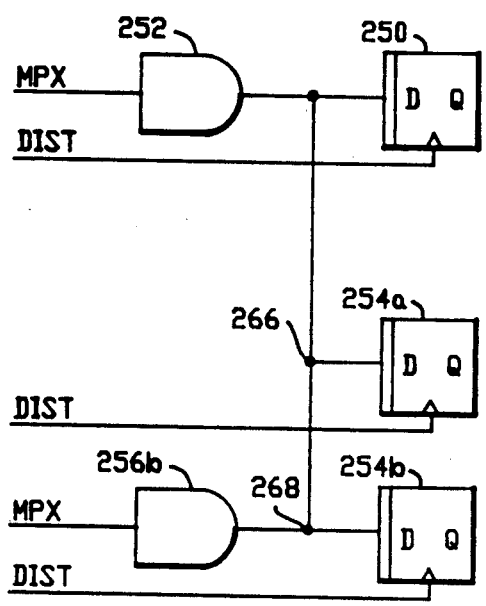

FIG. 9 shows yet another topology which does satisfy the above limitations for using the inventive technique. Here the driver 256a (see FIG. 8) has been eliminated, and when it is desired to apply a test data signal to the D input of associated latch 254a, the test data signal is routed through the driver 256b. It is true that the signal will reach the D input of associated latch 254b in addition to that of associated latch 254a, but this is of no consequence since the Q output of only associated latch 254a is observed. The Q output of associated latch 254b is disregarded. The topology of FIG. 9 satisfies the above-mentioned limitations since the junction between the cross-transmission wire and the conductor from the output of driver 256b to the D input of associated latch 254a, designated in the Figure as node 266, is as close to the D input of associated latch 254a as the junction 268 is to the D input of associated latch 254b.

An advantageous topology is an extension of that shown in FIG. 9, in which a single wire connects the D inputs of a long string of latches, with only one driver and one termination provided at either end of the wire. Typically the latch closest to one of the drivers is considered the reference latch, but there is no reason why one of the other latches in the string cannot be considered the reference latch instead. This topology is advantageous in that it minimizes the number of drivers and terminations required, but it is disadvantageous in that it is difficult to maintain good transmission line characteristics along the length of the cross-transmission wire, since undesirable reflections can occur at each connection to the D input of a latch.

Figure 10:
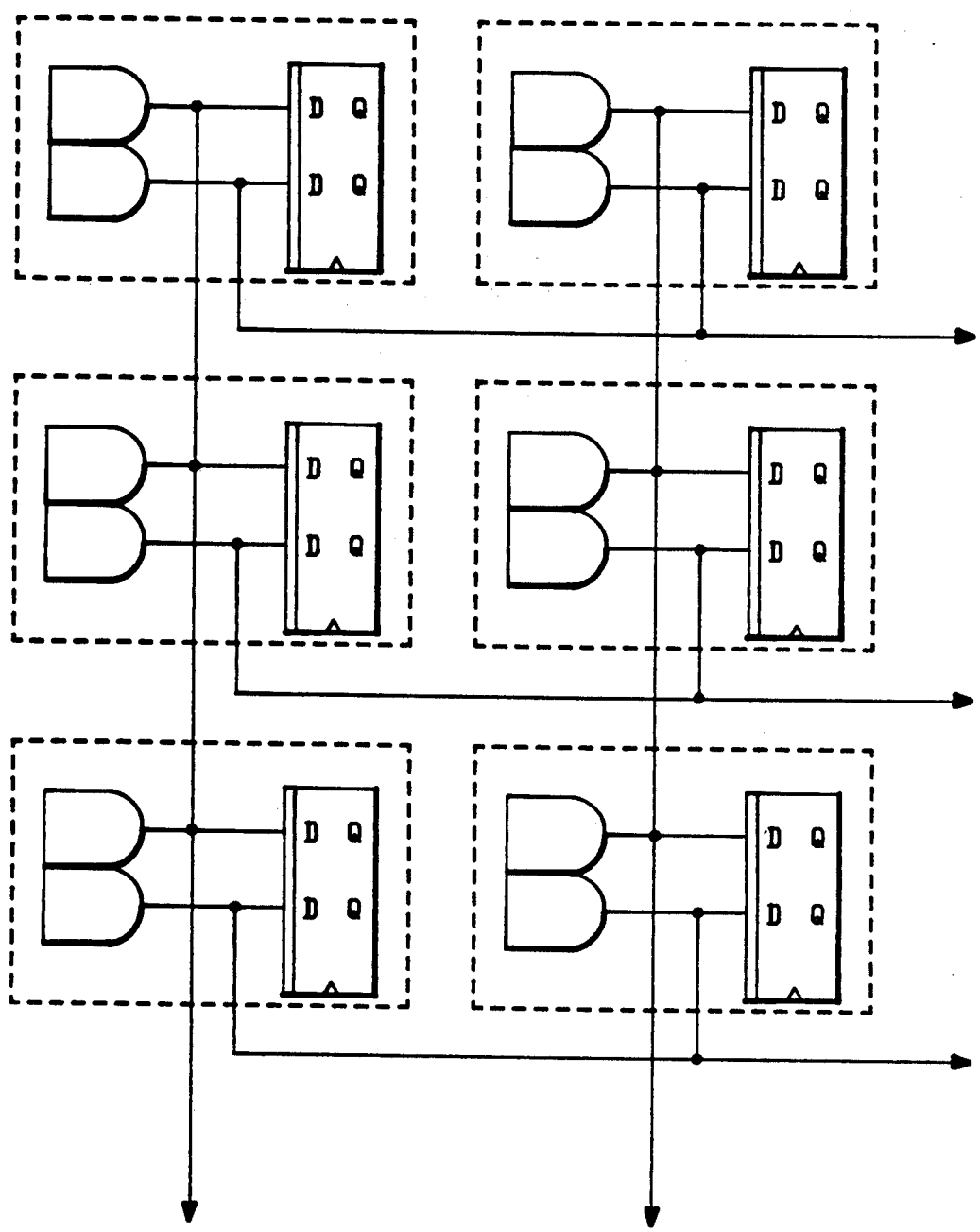

FIG. 10 shows yet another topology for cross-transmission means implementation. In this variation, the various latches to which clock offset is to be measured are thought of as being arranged in a two-dimensional matrix. The D inputs of all the latches in each column are connected together by cross-transmission wires, and all the latches in each row are connected together by different cross-transmission wires. The clock offset to each latch is then determined twice, once using the vertical cross-transmission wires and once using the horizontal cross-transmission wires. Any of a number of known matrix techniques can then be used to derive a single clock offset figure for each of the latches, with higher accuracy than is attainable with only a single group of measurements for each latch. It will be appreciated that the additional variations are possible in which clock offset to the each latch is determined as a function of three or more preliminary determinations.

Multiple Levels of Clock Offset Determination

Once the clock offset of latches in a first level of latches is determined with respect to a first reference latch, one of the latches in the first level, or another latch in the same chip as one of the latches in the first level, may be used in turn as a second reference latch in order for determining the clock offset of latches in a second level of latches. The clock offset between a latch in the second level relative to the first reference latch is then equal to the clock offset of the second level latch with respect to the second reference latch in the first level, plus the clock offset of the second reference latch with respect to the first reference latch.

For example, using the topology of FIG. 8, once the clock offset of latch 254a is determined relative to latch 250, latch 254a may then be used as the reference latch for determining the clock offset of latch 254b. The total clock offset between reference latch 250 and latch 254b is then equal to the clock offset of latch 254b determined With respect to latch 254a, plus the clock offset of latch 254a determined with respect to latch 250. A similar technique can be used with other topologies, including the topology of FIG. 9.

It should be noted that the determination of clock offsets using a multiple-level technique is a function of the cross-transmission line topology and of the choice of latches for which various TA1, TA2, TB1 and TB2 measurements are made, not of the topology of the clock distribution tree which drives the different latches. Thus a second level latch may well receive its clock pulse earlier than the first level latch to which it is referenced receives its clock pulse, in which case the clock offset of the second level latch with respect to the first level latch will be negative. When added to the offset of the first level latch with respect to the first reference latch, it will be determined, properly, that the clock offset of the second level latch with respect to the first reference latch is smaller than the clock offset of the first level latch with respect to the first reference latch.

If the multiple-level technique is used, then the clock offset calculated for each level will have slightly more error than that of the previous level. It is desirable, therefore, to determine which latches in a particular system design require a higher precision in the clock tuning, and to implement those latches at the lowest available level.

Use With Multiple Clock Phases

In high-performance systems, it is often desirable to have different latches or latch points operate on different phases of the clock signal. For example, some latches may operate on a "normal" clock phase CN, which is the normal system clock signal, while others are intended to operate on a "late" clock phase CL, which occurs at a fixed number of nanoseconds following the CN phase. Still other latches may be intended to operate on an "early" phase CE of the clock, which occurs at a known and fixed time preceding the CN clock phase.

The invention may be used to tune each of the phases of the clock signal first by determining the clock offset to each of the desired clock points for all phases of the clock signal, and then inserting into the clock paths to all of the CN and CL clock points the appropriate fixed delays to ensure that all of the CN clock points receive the clock signal at the desired time following the time that all of the CE clock points receive their clock signal, and that all of the CL clock points receive their clock signal at the desired time following the time when the CN clock points receive their clock signal. The actual measurements of the clock offset to each of the clock points may be made using any of the variations described above for the inventive technique.

System-Wide Clock Tuning

Figure 11:
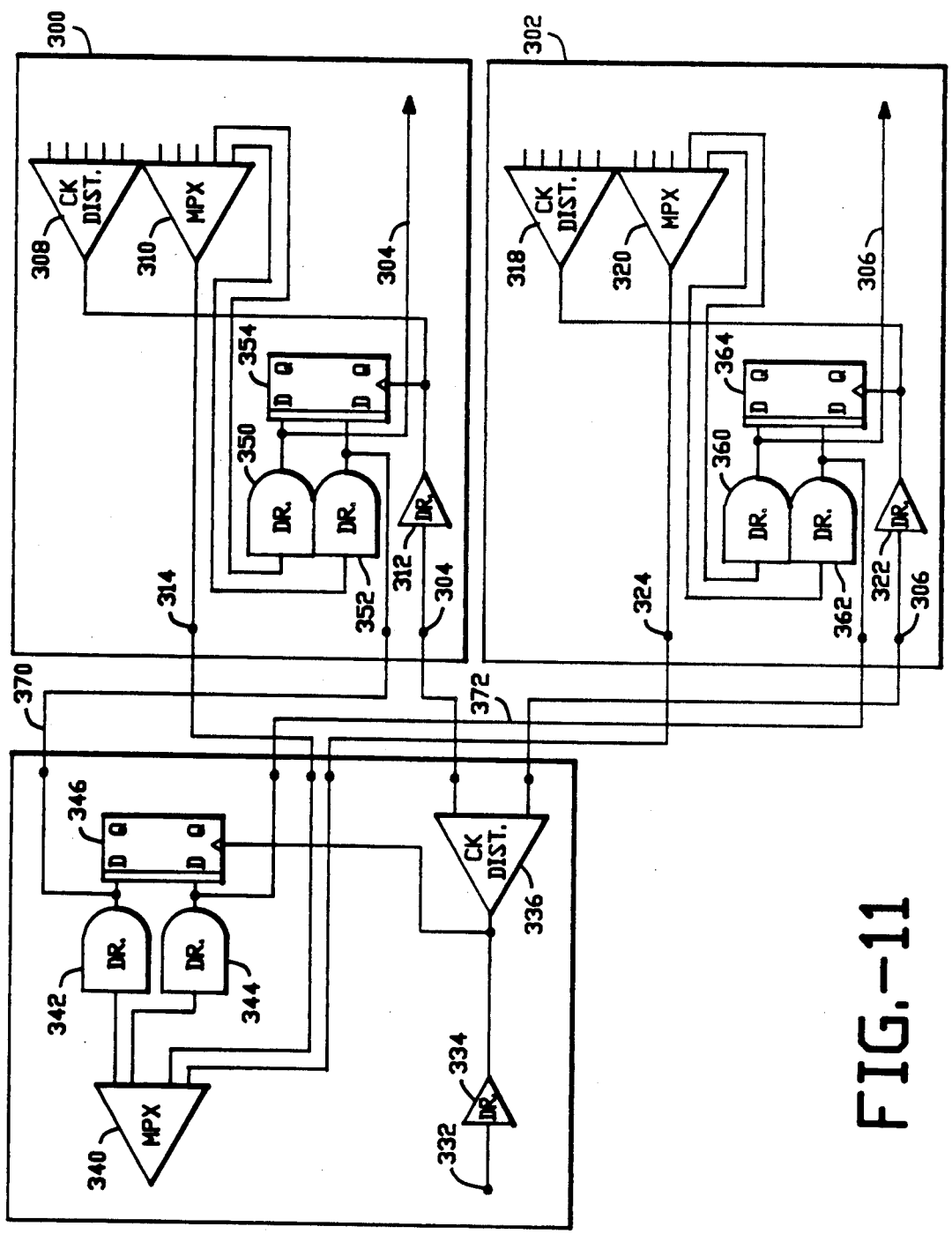

The inventive clock offset measurement technique, described above for measuring the clock offset of different chips on a board with reference to a point on the board, can also be used to measure the clock offset of different boards in a system with respect to some other point in the system. FIG. 11 illustrates a system having apparatus for accomplishing this.

The system consists of two boards 300 and 302, on which many latch points (not shoWn in FIG. 11) are placed. The clock offset of each of the latch points on board 300 are measured and tuned with respect to a board clock input node 304, and the clock offset of each of the latch points on board 302 are measured and tuned with respect to a board clock input node 306. For the purpose of accomplishing such measurement and tuning, the board 300, like the board 100 in FIG. 3, includes a clock distribution tree 308 and a test data signal multiplexer 310. The input of the clock distribution tree 308 is connected to the output of a clock driver 312, the input of which is connected to board clock input node 304. The input of test data signal multiplexer 310 is connected to a board test data source point 314. Similar connections are included on board 302, using clock distribution tree 318, test data distribution multiplexer 320, board clock driver 322 and board test data source point 324. The system also includes a system clock distribution board 330, which includes a system clock source point 332, connected to the input of a system clock driver 334, the output of which is connected to the input of a system clock distribution tree 336. The different outputs of the system clock distribution tree 336 are connected via inter-board cabling to respective board clock input nodes 304 and 306. The system may well include many other boards, but for simplicity, only two are shown in FIG. 11.

In order to implement system-wide clock tuning, the system clock distribution board 330 further includes a system test data distribution multiplexer 340, two outputs of which are connected via cabling to, respectively, board test data source points 314 and 324 on boards 300 and 302, respectively. Two other outputs of the system test data distribution multiplexer 340 are connected to inputs, respectively, of drivers 342 and 344 on the system clock distribution card 330. The outputs of drivers 342 and 344 are connected, respectively, to two D inputs of a two-input latch 346 on the board 330, the clock input of which is connected to the output of system clock driver 334.

On the board 300 there is further provided a pair of drivers 350 and 352, the outputs of which are connected, respectively, to two D inputs of a two-input latch 354, the clock input of which is connected to the output of board clock driver 312. Similarly, board 302 is further provided with a pair of drivers 360 and 362, the outputs of which are connected to respective D inputs of a two-input latch 364, the clock input of which is connected to the output of board clock driver 322. The inputs of drivers 350 and 352 are connected to two respective outputs of the board test data distribution multiplexer 310 on the board 300, and the inputs of drivers 360 and 362 are connected to two respective outputs of board test data distribution multiplexer 320 on the board 302. It will be appreciated based on the discussions above that other forms of latches or latch points may be used in place of two-input latches 346, 354 and 364.

In addition to the inter-board cables already described, a cross-transmission cable 370 couples one of the D inputs of latch 346 on the system clock distribution board to one of the D inputs of the latch 354 on the subject board 300, and another cross-transmission cable 372 couples the other of the D inputs of latch 346 on system clock distribution board 330 to one of the D inputs of latch 364 on subject board 302. The other D input of latch 354 is connected by a cross-transmission wire 374 to the D inputs of other latches on the board 300, and the other D input of latch 364 is connected by a cross-transmission wire 376 to other latches on the board 302.

Once again, the operation of the apparatus of FIG. 11 for tuning each of the latch points 354 and 364 with respect to the latch point 346 on the system clock distribution card is the same as previously described with respect to FIG. 3. The only important difference is that the clock offsets determined will be larger than those determined on a single board, because the cabling between boards is usually much longer than the clock distribution paths on any given board.

Once the clock offset of each of the latch points 354 and 364 are determined with respect to the latch point 346, respective cross-transmission wires 374 and 376 may then be used to measure clock offsets of other latches on respective boards 300 and 302, using the latch points 354 and 364 as the respective reference latches. Appropriate delays may be inserted in the individual clock paths on each of the board 300 and 302, or they may be inserted in the paths from the system clock source point 332 to the respective board clock input nodes 304 and 306, or both.

The latch point 354 on board 300 as shown in FIG. 11 is prior to the clock distribution tree 308 on such board. That is, the clock input of the latch is connected to the output of board clock driver 312 instead of to an output clock distribution tree 308. This is not essential, but it is desirable since it helps to ensure that all the other latch points on the board 300 will all have positive clock offsets relative to latch point 254. The same is true on board 302.

While the invention may be used for clock tuning of the clock input nodes of multiple boards to a single clock point in a system, board-to-board clock tuning may more easily be accomplished by precisely cutting the inter-board cables to ensure a constant delay. On the system clock distribution board 330, the path delay from the system clock source point 332 to each of the outputs of the system clock distribution tree 336 is made equal either by the inventive method or by any other known method.

The invention has been described with respect to particular embodiments thereof, and it will be understood that numerous variations are possible within its scope. For example, whereas the above description assumes that the signal paths which are to be tuned are clock signal paths, it will be appreciated that paths carrying other forms of data may be tuned using the same technique. These and other variations are all intended to be within the scope of the claims.

What is claimed is:

1. A system including a plurality of latch points, said plurality of latch points including a first reference latch point and a first subject latch point, each latch point in said plurality having a clock input, a data input and a data output, each latch point in said plurality supplying to its data output in response to a given clock pulse received at the clock input of said latch point a value responsive to that data present at the data input of said latch point when an effective edge of said given clock pulse reaches the clock input of said latch point, said system further including a clock source point and clock distribution means for transmitting a clock signal from said clock source point to the clock input of each of said plurality of latch points, said system further including apparatus for measuring clock skew between said first reference latch point and said first subject latch point, said apparatus comprising:

a test data source point;

adjustable means for delivering strings of at least one clock pulse each to said clock source point, and for delivering to said test data source point a test data signal having a logic level transition at a presettable time relative to the time at which said strings of clock pulses are delivered to said clock source point;

a first associated latch point which is part of said plurality of latch points, said first associated latch point having negligible clock skew with respect to said first subject latch point;

test data distribution means for routing a test data signal from said test data source point selectably to the data input of said first reference latch point or to the data input of said first associated latch point;

first cross-transmission means for bi-directionally transmitting to the data input of each of said first reference and first associated latch points the data signal which appears on the data input of the other of said first reference and first associated latch points;

means for adjusting said presettable time to determine a first TA1 setting at which the path delay from said clock source point to the clock input of said first reference latch point substantially equals the path delay from said clock source point via said test data distribution means to the data input of said first reference latch point, said test data distribution means being set to route said test data signal to the data input of said first reference latch point;

means for adjusting said presettable time to determine a first TA2 setting at which the path delay from said clock source point to the clock input of said first associated latch point substantially equals the path delay from said clock source point via said test data distribution means and said first cross-transmission means to the data input of said first associated latch point, said test data distribution means being set to route said test data signal to the data input of said first reference latch point;

means for adjusting said presettable time to determine a first TB2 setting at which the path delay from said clock source point to the clock input of said first associated latch point substantially equals the path delay from said clock source point via said test data distribution means to the data input of said first associated latch point, said test data distribution means being set to route said test data signal to the data input of said first associated latch point; and means for adjusting said presettable time to determine a first TB1 setting at which the path delay from said clock source point to the clock input of said first reference latch point substantially equals the path delay from said clock source point via said test data distribution means and said first cross-transmission means to the data input of said first reference latch point, said test data distribution means being set to route said test data signal to the data input of said first associated latch point, said first TA1, TA2, TB1 and TB2 settings being usable to calculate the clock skew between said first reference latch point and said first associated latch point.

2. A system according to claim 1, wherein said effective edge of said given clock pulse is the rising edge for a first one of said plurality of latch points and the falling edge for a second one of said plurality of latch points.

3. A system according to claim 1, wherein the first reference latch point comprises a D flip flop having a D input being the data input of said first reference latch point, a Q output being the data output of said first reference latch point and a clock input being the clock input of said first reference latch point.

4. A system according to claim 1, wherein said first associated latch point is on the same chip as said first subject latch point, so as to promote the negligibility of the clock skew between said first subject latch point and said first associated latch point.

5. A system according to claim 1, wherein said first cross-transmission means comprises a wire connected between the data input of said first reference latch point and the data input of said first associated latch point.

6. A system according to claim 1, wherein said adjustable means comprises:

clock means for delivering said strings of at least one clock pulse each to said clock source point; and test data signal generating means for delivering said test data signal to said test data source point, said test data signal generating means having a trigger input coupled to said clock source point and causing said logic level transition in said test data signal at said presettable time following activation of said trigger input.

7. A system according to claim 6, wherein, for each given string of clock pulses received at said trigger input of said test data signal generating means, the trigger is activated by a clock pulse in said given string other than the first clock pulse in said given string.

8. A system according to claim 6, wherein each string of clock pulses delivered to said clock source point consists of a series of clock pulses occurring at a frequency substantially equal to the frequency at which clock pulses will be delivered to the latch points in said plurality of latch points during normal system operation.

9. A system according to claim 8, wherein each string of clock pulses delivered to said clock source point follows the previous string of such clock pulses by at least the time period required for any reflections occurring on said first cross-transmission means to attenuate to a negligible level.

10. A system according to claim 1, further comprising a first operating card having first and second chips located thereon, said first reference latch point being located on said first chip and both said first subject latch point and said first associated latch point being located on said second chip, and wherein said clock distribution means, said test data distribution means and said first cross-transmission means are all permanently located on said first operating card.

11. A system according to claim 10, further comprising:
- a second operating card having a board clock input node;
- a clock distribution board having a board clock input node, first and second clock outputs and clock distribution means for transmitting a clock signal from said board clock input node on said clock distribution card to each of said clock outputs on said clock distribution card;
- means for tuning said clock distribution means on said clock distribution card such that a clock signal entering said board clock input node on said clock distribution card arrives at said first clock output at substantially the same time that it arrives at said second clock output;
- means for tuning said clock distribution means on said first operating card in accordance with said settings TA1, TA2, TB1 and TB2;
- first means for coupling said first clock output to said clock source point on said first operating card, said first means for coupling having a first known insertion delay; and
- second means for coupling said second clock output to said board clock input node on the second operating card, said second means for coupling having a second known insertion delay substantially equal to said first known insertion delay.

12. A system according to claim 1, wherein the plurality of latch points further includes a second subject latch point, said system further including apparatus for measuring clock skew between said first reference latch point and said second subject latch point comprising:
- a second associated latch point which is part of said plurality of latch points, said second associated latch point having negligible clock skew with respect to said second subject latch point;
- second cross-transmission means for bi-directionally transmitting to the data input of each of said first reference and second associated latch points the data signal which appears on the data input of the other of said first reference and second associated latch points;
- means for adjusting said presettable time to determine a second TA1 setting at which the path delay from said clock source point to the clock input of said first reference latch point substantially equals the path delay from said clock source point via said test data distribution means to the data input of said first reference latch point, said test data distribution means being set to route said test data signal to the data input of said first reference latch point;
- means for adjusting said presettable time to determine a second TA2 setting at which the path delay from said clock source point to the clock input of said second associated latch point substantially equals the path delay from said clock source point via said test data distribution means and said second cross-transmission means to the data input of said second associated latch point, said test data distribution means being set to route said test data signal to the data input of said first reference latch point;
- means for adjusting said presettable to determine a second TB2 setting at which the path delay from said clock source point to the clock input of said second associated latch point substantially equals the path delay from said clock source point via said test data distribution means to the data input of said second associated latch point, said test data distribution means being set to route said test data signal to the data input of said second associated latch point; and
- means for adjusting said presettable time to determine a second TB1 setting at which the path delay from said clock source point to the clock input of said first reference latch point substantially equals the path delay from said clock source point via said test data distribution means and said second cross-transmission means to the data input of said first reference latch point, said test data distribution means being set to route said test data signal to the data input of said second associated latch point,
- said second TA1, TA2, TB1 and TB2 settings being usable to calculate the clock skew between said first reference latch point and said second associated latch point.

13. A system according to claim 12, wherein said first cross-transmission means comprises a wire connected between the data input of said first reference latch point and the data input of said first associated latch point, and wherein said second cross-transmission means comprises a connection between the data input of said second associated latch point and a point on said wire between the data input of said first reference latch point and the data input of said first associated latch point, inclusive.

14. A system according to claim 13, wherein said test data distribution means additionally has means for routing said test data signal from said test data source point selectively to the data input of said second associated latch point.

15. A system according to claim 12, wherein said test data distribution means additionally has means for routing said test data signal from said test data source point selectably to the data input of said second associated latch point, wherein said second cross-transmission means comprises a wire connected between the data input of said first reference latch point and the data input of said second associated latch point, and wherein said first cross-transmission means comprises a connection between the data input of said first associated latch point and a point on said wire between the data input of said first reference latch point and the data input of said second associated latch point, inclusive.

16. A system according to claim 1, wherein said plurality of latch points further includes an additional latch point, said test data distribution means having means for routing said test data signal from said test data source point selectably to the data input of said additional latch point, said system further including apparatus for measuring clock skew between said first associated latch point and said additional latch point comprising:

additional cross-transmission means for bi-directionally transmitting to the data input of each of said first associated and additional latch points the data signal which appears on the data input of the other of said first associated and additional latch points;

means for adjusting said presettable time to determine an additional TA1 setting at which the path delay from said clock source point to the clock input of said first associated latch point substantially equals the path delay from said clock source point via said test data distribution means to the data input of said first associated latch point, said test data distribution means being set to route said test data signal to the data input of said first associated latch point;

means for adjusting said presettable time to determine an additional TA2 setting at which the path delay from said clock source point to the clock input of said additional latch point substantially equals the path delay from said clock source point via said test data distribution means and said additional cross-transmission means to the data input of said additional latch point, said test data distribution means being set to route said test data signal to the data input of said first associated latch point;

means for adjusting said presettable time to determine an additional TB2 setting at which the path delay from said clock source point to the clock input of said additional latch point substantially equals the path delay from said clock source point via said test data distribution means to the data input of said additional latch point, said test data distribution means being set to route said test data signal to the data input of said additional latch point; and means for adjusting said presettable time to determine an additional TB1 setting at which the path delay from said clock source point to the clock input of said first associated latch point substantially equals the path delay from said clock source point via said test data distribution means and said additional cross-transmission means to the data input of said first associated latch point, said test data distribution means being set to route said test data signal to the data input of said additional latch point, said additional TA1, TA2, TB1 and TB2 settings being usable to calculate the clock skew between said first associated latch point and said additional latch point.

17. A system according to claim 1, wherein said plurality of latch points further includes an additional latch point, said system further including apparatus for measuring clock skew between said first reference latch point and said additional latch point comprising:

a second reference latch point which is part of said plurality of latch points, said second reference latch point having negligible clock skew with respect to said first reference latch point, said test data distribution means having means for routing said test data signal from said test data source point selectably to the data input of said additional latch point or to the data input of said second reference latch point;

second cross-transmission means for bi-directionally transmitting to the data input of each of said second reference and additional latch points the data signal which appears on the other of said second reference and additional latch points;

means for adjusting said presettable time to determine a second TA1 setting at which the path delay from said clock source point to the clock input of said second reference latch point substantially equals the path delay from said clock source point via said test data distribution means to the data input of said second reference latch point, said test data distribution means being set to route said test data signal to the data input of said second reference latch point;

means for adjusting said presettable time to determine a second TA2 at which the path delay from said clock source point to the clock input of said additional latch point substantially equals the path delay from said clock source point via said test data distribution means and said second cross-transmission means to the data input of said additional latch point, said test data distribution means being set to route said test data signal to the data input of said second reference latch point;

means for adjusting said presettable time to determine a second TB2 setting at which the path delay from said clock source point to the clock input of said additional latch point substantially equals the path delay from said clock source point via said test data distribution means to the data input of said additional latch point, said test data distribution means being set to route said test data signal to the data input of said additional latch point;

means for adjusting said presettable time to determine a second TB1 setting at which the path delay from said clock source point to the clock input of said second reference latch point substantially equals the path delay from said clock source point via said test data distribution means and said second cross-transmission means to the data input of said second reference latch point, said test data distribution means being set to route said test data signal to the data input of said additional latch point, the second TA1, TA2, TB1 and TB2 settings being usable to calculate the clock skew between said first reference latch point and said additional latch point.

18. A system according to claim 1, wherein said first associated latch point is adapted to supply a first logic level to its data output if said logic level transition in said test data signal delivered by said adjustable means in conjunction with each given string of clock pulses reaches the data input of said first associated latch point prior to a particular time relative to the time that an effective edge of the last clock pulse in said given string of clock pulses reaches the clock input of said first associated latch point, and is adapted to supply a second logic level to its data output if said logic level transition reaches the data input of said first associated latch point subsequent to said particular time relative to the time that said effective edge of said last clock pulse in said given string of clock pulses reaches the clock input of said first associated latch point, and wherein said means for adjusting the presettable time to determine a first TA2 setting comprises:

means for repetitively causing said adjustable means to deliver strings of clock pulses to said clock source point and corresponding test data signals to said test data source point; and means for changing said presettable time for different ones of said strings of clock pulses until a setting is determined at which said first associated latch point supplies to its data output said first logic level for substantially half of the strings of clock pulses and said second logic level for substantially half of the strings of clock pulses.

19. A system according to claim 1,
wherein said first associated latch point supplies a first logic level to its data output if said logic level transition in said test data signal delivered by said adjustable means in conjunction with each given string of clock pulses reaches the data input of said first associated latch point prior to a particular time relative to the time that an effective edge of the last clock pulse in said given string of clock pulses reaches the clock input of said first associated latch point, and supplies a second logic level to its data output if said logic level transition reaches the data input of said first associated latch point subsequent to said particular time relative to the time that said effective edge of said last clock pulse in said given string of clock pulses reaches the clock input of said first associated latch point,
wherein said presettable time in said adjustable means is presettable in increments,
and wherein said means for adjusting the presettable time to determine a first TA2 setting comprises:
means for repetitively causing said adjustable means to deliver strings of clock pulses to said clock source point and corresponding test data signals to said test data source point; and
means for changing said presettable time for different ones of said strings of clock pulses until a first incremental setting of said presettable time is determined at which said first associated latch point supplies to its data output said second logic level for less than half of said strings of clock pulses and said first logic level for more than half of said strings of clock pulse s and at which the next higher incremental setting of said presettable time causes said first associated latch point to supply to its data output said second logic level for more than half of said strings of clock pulses and said first logic level for less than half of said strings of clock pulses, interpolation between said first incremental setting and said next higher incremental setting being usable to calculate an approximation of TA2.

20. A system according to claim 1, wherein said means for adjusting said presettable time to determine a first TA2 setting comprises:
means for adjusting said presettable time to determine a first TA2+ setting, the logic level transition in said test data signal delivered by said adjustable means to said test data source point in conjunction with each string of clock pulses delivered by said adjustable means to said clock source point during operation of said first means being from a 0 level to a 1 level; and
second means for adjusting said presettable time to determine a first TA2− setting, the logic level transition in said test data signal delivered by said adjustable means to said test data source point in conjunction with each string of clock pulses delivered by said adjustable means to said clock source point during operation of said second means being from a 1 level to a 0 level,
said first TA2+ and TA2− settings being usable to calculate an approximation for said first TA2 setting between said first TA2+ setting and said first TA2− setting.

21. A method for measuring the clock offset of a first subject latch point relative to a reference latch point, comprising the steps of:
delivering to a clock source point a series of bursts of clock pulses having at least one clock pulse per burst;
delivering a corresponding series of test data signals to a test data source point, each of said test data signals being delivered in response to a corresponding one of said bursts of clock pulses, each of said test data signals having a logic level transition at a presettable time relative to the time at which said corresponding one of said bursts of clock pulses are delivered to said clock source point;
adjusting said presettable time for different ones of said bursts of clock pulses in said series to determine a TA2 setting at which the path delay from said clock source point to a clock input of a first associated latch point fabricated on the same chip as said first subject latch point substantially equals the path delay from said clock source point, via said test data source point to a data input of said reference latch point and, via a cross-transmission conductor, on to a data input of said first associated latch point;
adjusting said presettable time for different ones of said bursts of clock pulses in said series to determine a TB1 setting at which the path delay from said clock source point to a clock input of said reference latch point substantially equals the path delay from said clock source point, via said test data source point to said data input of said first associated latch point and, via said cross-transmission conductor, on to said data input of said reference latch point;
adjusting said presettable time for different ones of said bursts of clock pulses in said series to determine a TA1 setting at which the path delay from said clock source point to said clock input of said reference latch point substantially equals the path delay from said clock source point, via said test data source point to said data input of said reference latch point, all via paths not including any substantial part of said cross-transmission conductor; and
adjusting said presettable time for different ones of said bursts of clock pulses in said series to determine a TB2 setting at which the path delay from said clock source point to said clock input of said first associated latch point substantially equals the path delay from said clock source point, via said test data source point to said data input of said first associated latch point, all via paths not including any substantial part of said cross-transmission conductor.

22. A method affording to claim 21, further comprising the step of determining said clock offset of said first subject latch point relative to said reference latch point substantially as $[(TA2+TB2)-(TA1+TB1)/2.$ 23. A method according to claim 21, wherein said step of delivering a series of bursts comprises the step of delivering a series of bursts of clock pulses having at least 10 clock pulses per burst, the clock pulses in each of said bursts occurring at substantially the normal operating clock frequency.

24. A method according to claim 21, further comprising the step of separating each of said bursts of clock pulses from the previous burst of clock pulses in said series by at least the time period required for any reflections occurring on said cross-transmission conductor to attenuate to a negligible level.

25. A method according to claim 21, wherein said clock source point is located on a first electrical circuit board, further comprising the steps of:
providing a second electrical circuit board having a clock source point;
providing system clock distribution apparatus having a system clock source point and first and second clock outputs, the path delay from said system clock source point to said first clock output substantially equaling the path delay from said system clock source point to said second clock output;
coupling said first clock output to said clock source point on said first board with apparatus having a first known insertion delay; and
coupling said second clock output to said clock source point on said second board with apparatus having a second known insertion delay substantially equal to said first known insertion delay.

26. A method according to claim 22, further for measuring the clock offset of a second subject latch point relative to said reference latch point, further comprising the steps of:
determining the clock offset of said second subject latch point relative to said first subject latch point; and
adding the clock offset of said first subject latch point relative to said reference latch point.

27. A method according to claim 21, wherein said reference latch point is adapted to supply a first logic level to a data output of said reference latch point if said logic level transition in said test data signal reaches said data input of said reference latch point prior to a particular time relative to the time that an effective edge of the last clock pulse in the corresponding burst of clock pulses reaches said clock input of said reference latch point, and is adapted to supply a second logic level to said data output of said reference latch point if said logic level transition reaches said data input of said reference latch point subsequent to said particular time relative to the time that said effective edge of said last clock pulse in said corresponding burst of clock pulses reaches said clock input of said reference latch point,
and wherein said step of adjusting said presettable time for different ones of said bursts to determine a TA1 setting comprises the step of adjusting said presettable time for different ones of said bursts until a setting is determined at which said reference latch point supplies to its data output said first logic level for substantially half of said bursts of clock pulses and said second logic level for substantially half of said bursts of clock pulses.

28. A method according to claim 21, wherein said reference latch point is adapted to supply a first logic level to a data output of said reference latch point if said logic level transition in said test data signal reaches said data input of said reference latch point prior to a particular time relative to the time that an effective edge of the last clock pulse in the corresponding burst of clock pulses reaches said clock input of said reference latch point, and is adapted to supply a second logic level to said data output of said reference latch point if said logic level transition reaches said data input of said reference latch point subsequent to said particular time relative to the time that said effective edge of said last clock pulse in said corresponding burst of clock pulses reaches said clock input of said reference latch point,
and wherein said step of adjusting said presettable time for different ones of said bursts to determine a TA1 setting comprises the steps of:
adjusting said presettable time only in increments for different ones of said bursts until a first incremental setting of said presettable time is determined at which said reference latch point supplies to its data output said second logic level for less than half of the bursts of clock pulses and said first logic level for more than half of said bursts of clock pulses and at which the next higher incremental setting of said presettable time causes said reference latch point to supply to its data output said second logic level for more than half of said bursts of clock pulses and said first logic level for less than half of said bursts of clock pulses; and
interpolating between said first incremental setting and said next higher incremental setting.

29. A method according to claim 21, wherein for a first group of said bursts of clock pulses said reference latch point is adapted to supply a first logic level to a data output of said reference latch point if said logic level transition in said test data signal reaches said data input of said reference latch point prior to a particular time relative to the time that an effective edge of the last clock pulse in the corresponding burst of clock pulses reaches said clock input of said reference latch point, and is adapted to supply a second logic level to said data output of said reference latch point if said logic level transition reaches said data input of said reference latch point subsequent to said particular time relative to the time that said effective edge of said last clock pulse in said corresponding burst of clock pulses reaches said clock input of said reference latch point,
wherein for a second group of said bursts of clock pulses said reference latch point is adapted to supply said second logic level to said data output of said reference latch point if said logic level transition in said test data signal reaches said data input of said reference latch point prior to said particular time relative to the time that an effective edge of the last clock pulse in the corresponding burst of clock pulses reaches said clock input of said reference latch point, and is adapted to supply said first logic level to said data output of said reference latch point if said logic level transition reaches said data input of said reference latch point subsequent to said particular time relative to the time that said effective edge of said last clock pulse in said corresponding burst of clock pulses reaches said clock input of said reference latch point,
and wherein said step of adjusting said presettable time for different ones of said bursts to determine a TA1 setting comprises the steps of:
adjusting said presettable time for different ones of said bursts in said first group of bursts to determine a first TA1 setting;
adjusting said presettable time for different ones of said bursts in said second group of bursts to determine a second TA1 setting; and
averaging said first and second TA1 settings.

30. A method according to claim 21, further for tuning the measured clock distribution paths, further comprising the steps of:

inserting into the clock distribution path to said first subject latch point a time delay of some constant K seconds, $K \geq 0$; and inserting to the clock distribution path to said reference latch point a time delay of K seconds plus said clock offset of said first subject latch point relative to said reference latch point.

31. A method according to claim 21, further for tuning the measured clock distribution paths, further comprising the steps of:

inserting into the clock distribution path to said subject latch point a time delay of some constant K seconds plus a phase delay of P seconds, $K \geq 0$ and $P > 0$; and inserting into the clock distribution path to said reference latch point a time delay of K seconds plus said clock offset of said first subject latch point relative to said reference latch point.

* * * * *